US011567139B2

(12) United States Patent  (10) Patent No.: US 11,567,139 B2
Sakai et al.  (45) Date of Patent: Jan. 31, 2023

(54) SECONDARY BATTERY DIAGNOSTIC DEVICE

(71) Applicant: HONDA MOTOR CO., LTD., Tokyo (JP)

(72) Inventors: Hiroshi Sakai, Saitama (JP); Pu Qian, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 28 days.

(21) Appl. No.: 17/191,723

(22) Filed: Mar. 4, 2021

(65) Prior Publication Data

US 2021/0278472 A1  Sep. 9, 2021

(30) Foreign Application Priority Data

Mar. 6, 2020 (JP) .............................. JP2020-039087

(51) Int. Cl.
| | |
|---|---|
| *G01R 31/392* | (2019.01) |
| *G01R 31/3835* | (2019.01) |
| *G01R 31/385* | (2019.01) |
| *H01M 10/0525* | (2010.01) |
| *H01M 10/44* | (2006.01) |
| *H01M 10/0562* | (2010.01) |
| *H01M 10/48* | (2006.01) |

(52) U.S. Cl.
CPC ......... *G01R 31/392* (2019.01); *G01R 31/385* (2019.01); *G01R 31/3835* (2019.01); *H01M 10/0525* (2013.01); *H01M 10/0562* (2013.01); *H01M 10/44* (2013.01); *H01M 10/48* (2013.01)

(58) Field of Classification Search
None
See application file for complete search history.

(56) References Cited

U.S. PATENT DOCUMENTS

| | | | | |
|---|---|---|---|---|
| 2002/0109506 A1* | 8/2002 | Kawakami | ........... | G01R 31/392 |
| | | | | 324/522 |
| 2013/0342212 A1* | 12/2013 | Kawahira | .......... | G01R 31/3835 |
| | | | | 324/433 |
| 2019/0027784 A1* | 1/2019 | Nose | ...................... | H01M 4/382 |
| 2020/0153256 A1* | 5/2020 | Park | ...................... | H02J 7/0036 |

FOREIGN PATENT DOCUMENTS

JP  2014006189 A  1/2014

* cited by examiner

*Primary Examiner* — Jas A Sanghera
(74) *Attorney, Agent, or Firm* — CKC & Partners Co., LLC

(57) ABSTRACT

A diagnostic device for a secondary battery which is an all-solid-state battery containing a solid electrolyte transporting lithium ions, in which the diagnostic device includes: an interruption means configured to interrupt a charging current or a discharging current of the secondary battery connected to a circuit; a measuring means configured to measure over time a variation characteristic of a terminal voltage of the secondary battery after the current is interrupted by the interruption means; and a diagnostic means configured to diagnose the cause of the degradation of the secondary battery by comparing a change rate or a change amount in voltage between a charging characteristic specified from measured values of a terminal voltage of the secondary battery measured by the measuring means, a charging/discharging characteristic specified from the measured values of the terminal voltage measured by the measuring means, and a reference characteristic of the secondary battery.

18 Claims, 5 Drawing Sheets

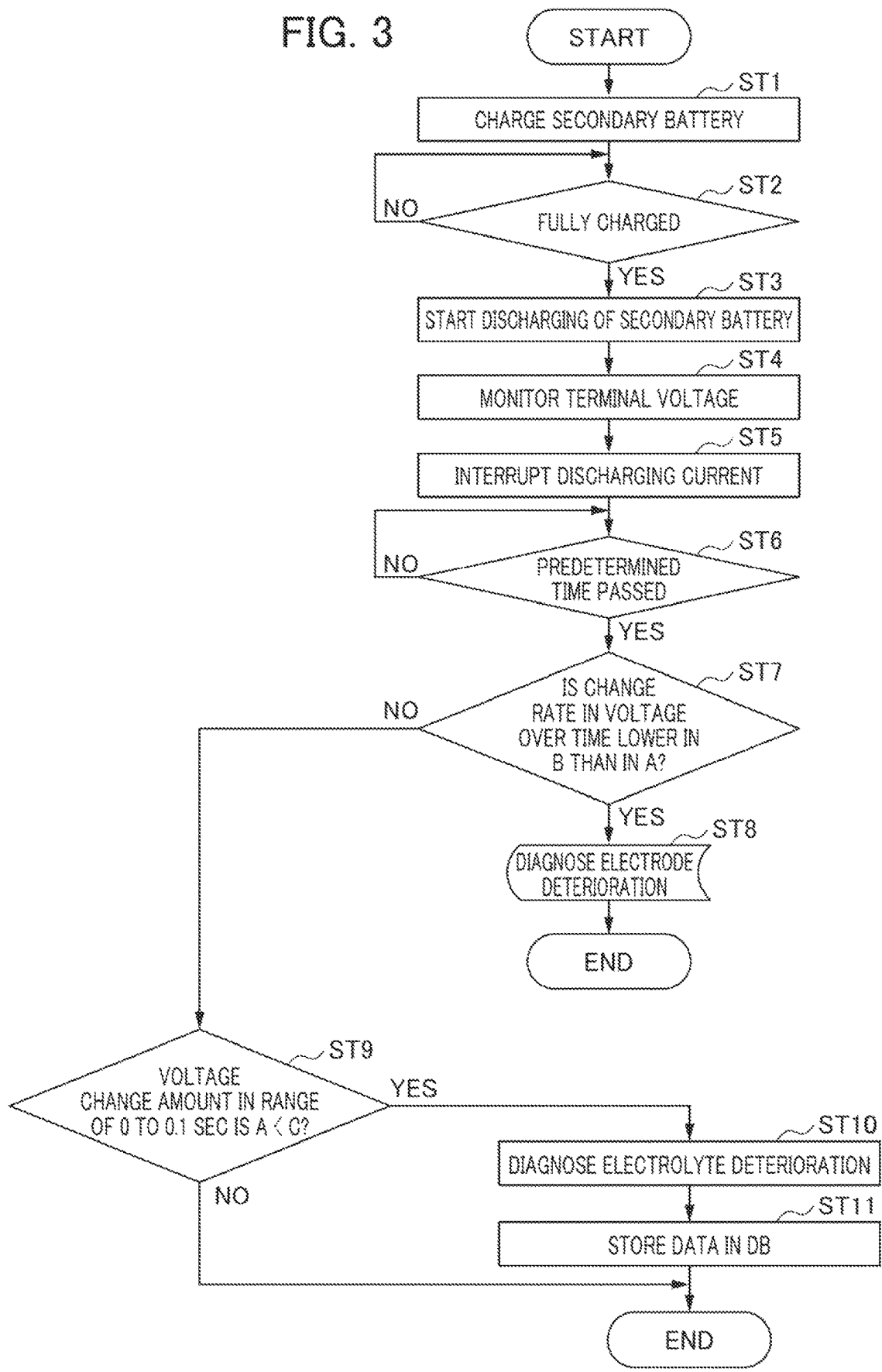

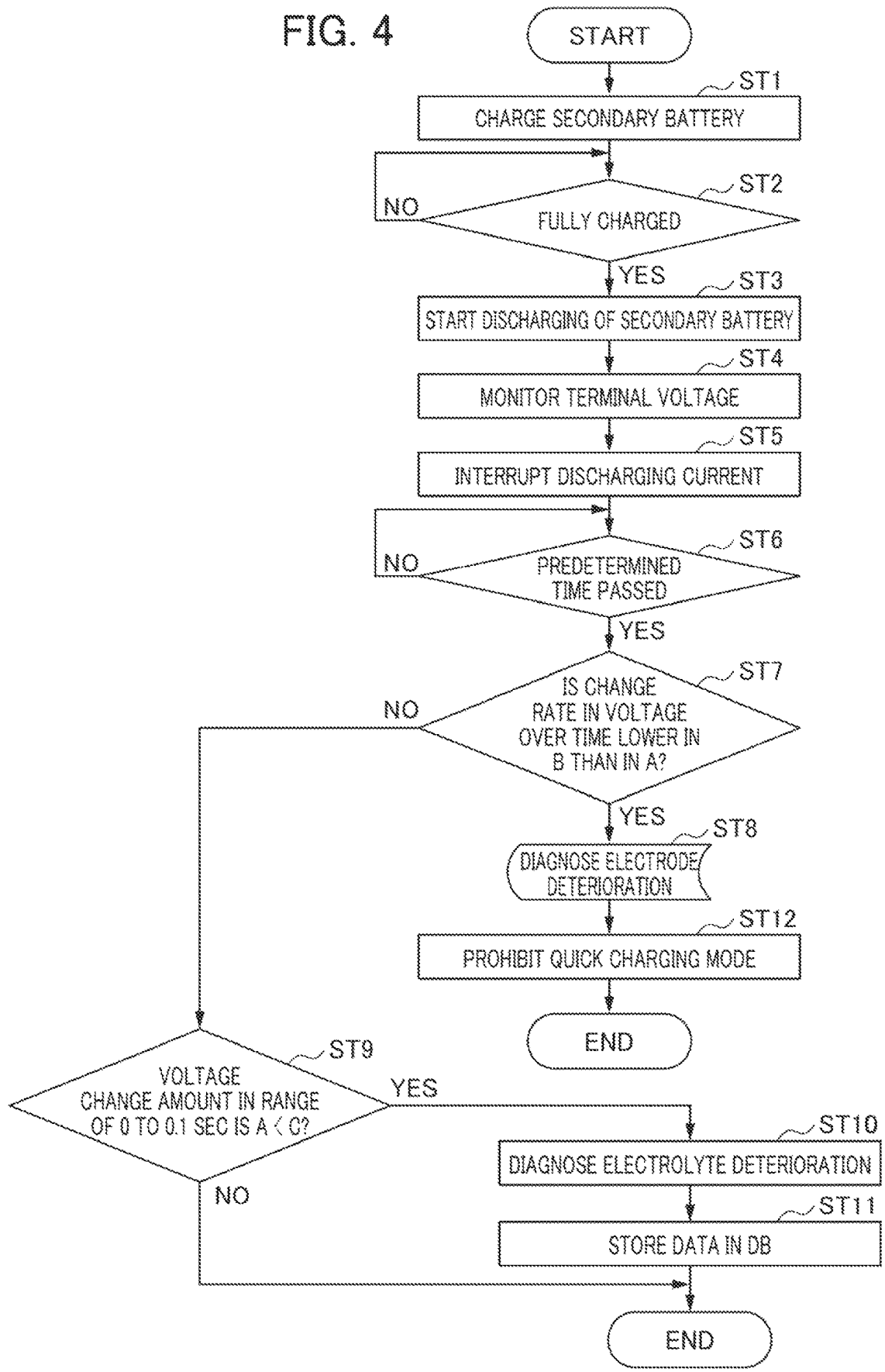

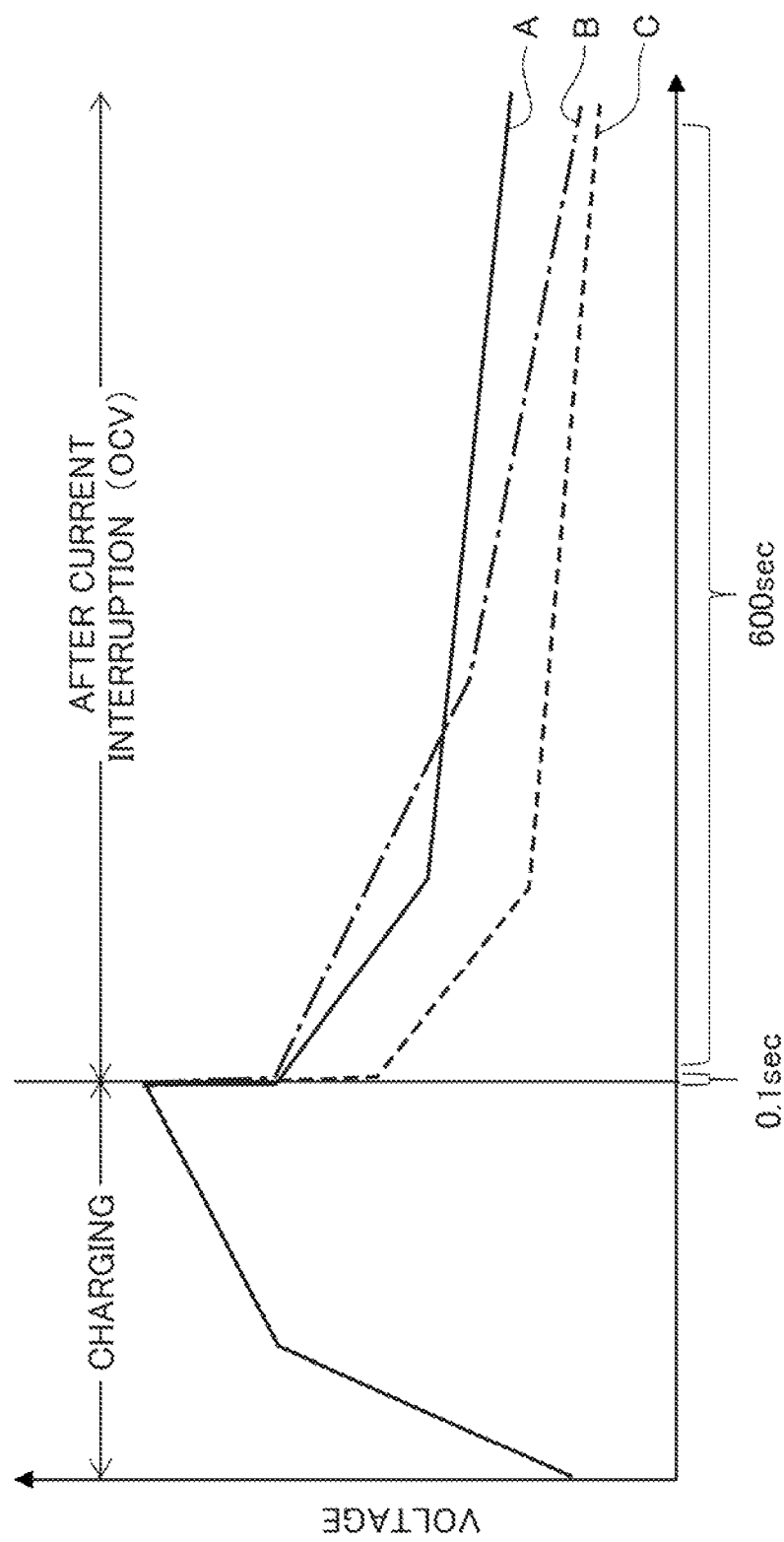

SECONDARY BATTERY DIAGNOSTIC DEVICE

This application is based on and claims the benefit of priority from Japanese Patent Application No. 2020-039087, filed on 6 Mar. 2020, the content of which is incorporated herein by reference.

BACKGROUND OF THE INVENTION

Field of the Invention

The present invention relates to a secondary battery diagnostic device.

Related Art

In a conventional secondary battery diagnostic device, a diagnostic means calculates the drop rate or the rise rate of a terminal voltage immediately after current interruption in a normal secondary battery based on the separator thickness and the ion diffusion coefficient and compares the calculated drop rate or rise rate with the drop rate or the rise rate of the terminal voltage immediately after the current interruption actually measured for a secondary battery to be diagnosed to thereby determine the presence or absence of degradation (for example, Patent Document 1).

Therefore, there has been a problem that the drop rate or the rise rate of the terminal voltage immediately after the current interruption actually measured for the secondary battery is compared with the calculated drop rate or rise rate, and therefore a considerable amount of time is required until the completion of the diagnosis of the state of the secondary battery, so that a secondary battery body generates heat resulting in damage due to the continuation of a quick charging operation, despite a state where the quick charging should be prohibited, for example.

Patent Document 1: Japanese Unexamined Patent Application, Publication No. 2014-6189

SUMMARY OF THE INVENTION

The secondary battery, which is an all-solid-state battery containing a solid electrolyte transporting lithium ions, has a characteristic that an ion concentration difference in the electrolyte is less likely to occur, unlike a battery containing an electrolytic solution.

The present invention has been made in view of the above-described prior art. It is an object of the present invention to provide a device capable of correctly diagnosing a secondary battery including an all-solid-state battery containing a solid electrolyte by easily distinguishing whether the cause of degradation of the secondary battery is due to electrode degradation or due to solid electrolyte degradation.

The present inventors have found that the cause of the degradation of the secondary battery including the all-solid-state battery containing the solid electrolyte can be specified by measuring the variation of a terminal voltage of the secondary battery over a predetermined time after interrupting a charging current or a discharging current of the secondary battery and comparing the behavior with that of a variation characteristic pattern of the terminal voltage modeled and stored in advance, and thus have accomplished the present invention.

The present invention relates to a secondary battery diagnostic device including: an interruption means configured to interrupt a charging current or a discharging current of a secondary battery connected to a charging circuit or a discharging circuit; a measuring means configured to measure over time a variation characteristic of a terminal voltage of the secondary battery after the charging current or the discharging current is interrupted by the interruption means; and a diagnostic means configured to diagnose a cause of degradation of the secondary battery by comparing a change rate or a change amount in voltage between a charging/discharging characteristic specified from a measured value of the terminal voltage of the secondary battery measured by the measuring means and a reference characteristic of the secondary battery based on an initial value.

The present invention can correctly diagnose whether the cause of the degradation of the secondary battery is due to electrode degradation or due to electrolyte degradation.

BRIEF DESCRIPTION OF THE DRAWINGS

FIG. 3 is a flowchart illustrating diagnostic processing of a degradation state of a secondary battery illustrating a first embodiment;

FIG. 4 is a flowchart illustrating diagnostic processing of a degradation state of a secondary battery illustrating a second embodiment; and FIG. 5 is a figure illustrating characteristics of a degradation diagnostic model stored in the storage unit illustrated in FIG. 1.

DETAILED DESCRIPTION OF THE INVENTION

First Embodiment

Figure 1:
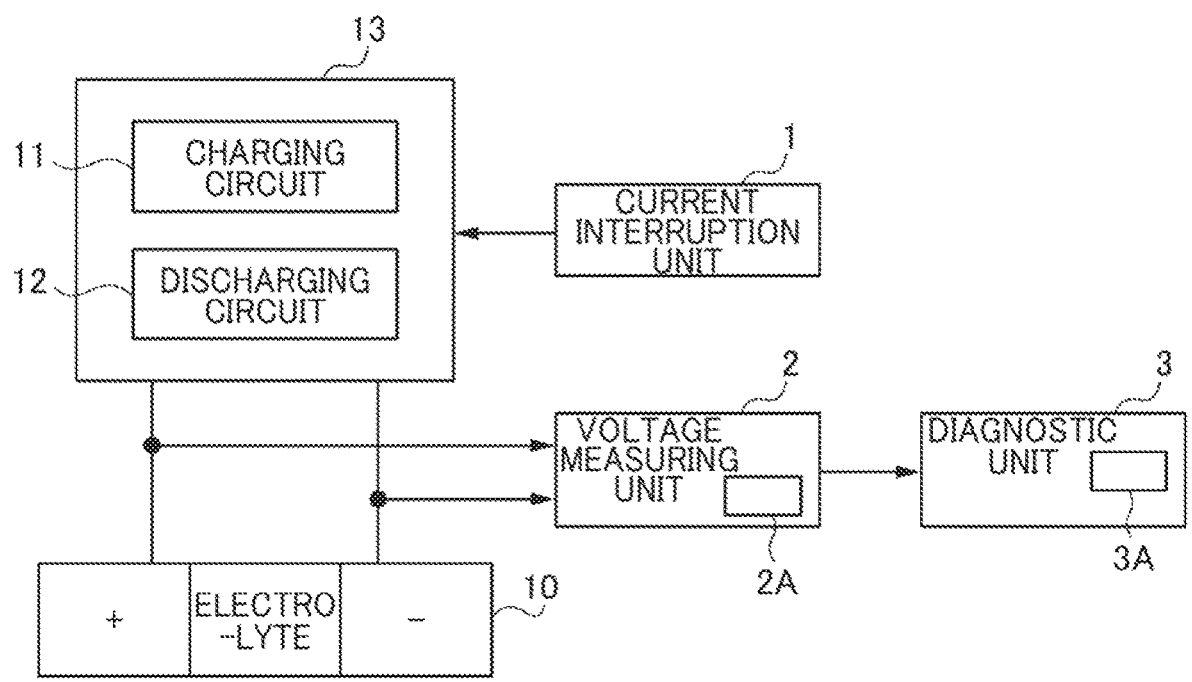
FIG. 1 is a block diagram illustrating the configuration of a secondary battery diagnostic device of the present invention.

FIG. 1 is a characteristic diagram illustrating the configuration of a secondary battery diagnostic device illustrating this embodiment. An all-solid-state battery applied in this embodiment is, for example, a lithium-ion battery (hereinafter simply referred to as a secondary battery). This embodiment gives a description by way of example in which the secondary battery is an all-solid-state battery containing a solid electrolyte transporting lithium ions.

In FIG. 1, a current interruption unit 1 as the interruption means interrupts a charging current or a discharging current during charging or discharging of a secondary battery 10 connected to a charging circuit 11 or a discharging circuit 12. A voltage measuring unit 2 continuously measures, by A/D conversion, a terminal voltage of the secondary battery 10 in which the charging current or the discharging current is interrupted by the current interruption unit 1. A charging control unit 13 selects either the charging circuit 11 or the discharging circuit 12 and switches between charging processing and discharging processing to the secondary battery 10.

A diagnostic unit 3 diagnoses degradation of the secondary battery 10 based on a variation over time of the terminal voltage measured by the voltage measuring unit 2 as the measuring means. Specifically, the diagnostic unit 3 as the diagnostic means includes a storage unit 3A storing charging data corresponding to the charging characteristic (reference characteristic) obtained by charging a non-degraded secondary battery for determining whether the cause of the degradation of the secondary battery is due to electrolyte degradation or electrode degradation by modeling and comparing histories over time.

The diagnostic unit 3 includes devices, such as a microprocessor or a CPU. A diagnostic program is stored in an EEPROM or the like. The diagnostic program and data indicating discharging characteristics measured by the voltage measuring unit 2 are stored in a RAM.

Figure 2:
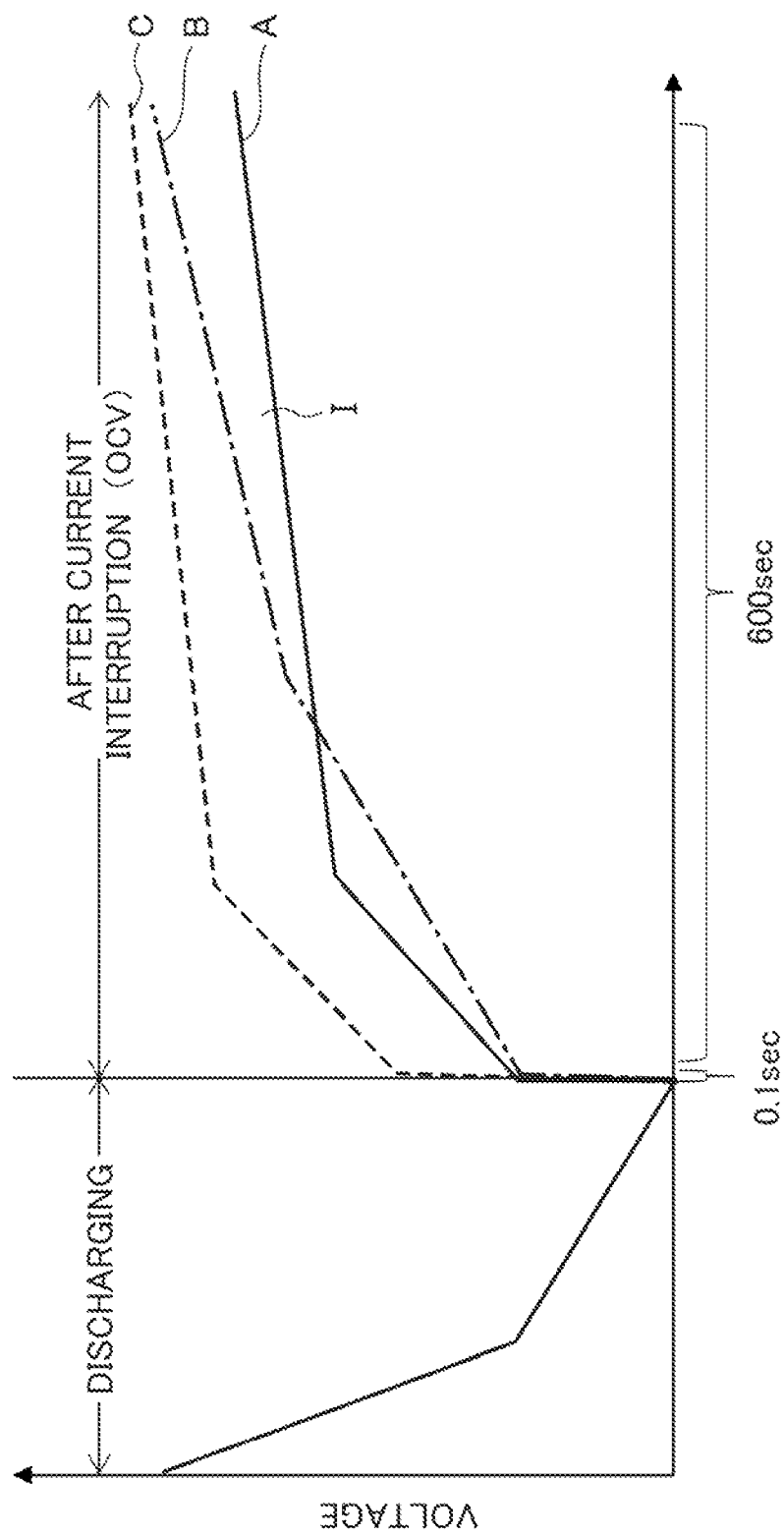
FIG. 2 is a figure illustrating characteristics of a degradation diagnostic model stored in a storage unit illustrated in FIG. 1.

FIG. 2 is a figure illustrating the concept of charging/discharging interruption characteristics of a degradation diagnostic model stored in the storage unit 3A illustrated in FIG. 1. FIG. 2 illustrates a case where the time axis in FIG. 2 is common to a reference characteristic A and voltage variation characteristics B and C of a secondary battery to be diagnosed described later. Further, this example illustrates the charging/discharging characteristics of the secondary battery 10 immediately after a discharging current is interrupted. Herein, the reference characteristic A is a characteristic indicated by a solid line in FIG. 2. The voltage variation characteristic B is a characteristic indicated by alternate long and short dashed lines in FIG. 2. The voltage variation characteristic C is a characteristic indicated by dashed lines in FIG. 2.

In FIG. 2, the vertical axis represents a terminal voltage value of the secondary battery 10 after degradation. In this embodiment, as the reference characteristic A before degradation, a charging characteristic is converted into data and stored in the storage unit 3A. The secondary battery diagnostic device is configured so that two or more of the charging characteristics can be stored to achieve the optimal charging characteristic according to the battery capacity or the like.

When diagnosing the degradation of the secondary battery 10 based on the variation over time of the terminal voltage (charging voltage) measured by the voltage measuring unit 2, the change rate in the charging voltage is compared between the charging characteristic B specified from measured values of the terminal voltage of the secondary battery and the reference characteristic A of the secondary battery based on the initial value. In the drawing, when it is determined that the change rate in the charging voltage indicated by the charging/discharging characteristic in a range of 0.1 to 600 sec (change rate in voltage corresponding to the charging/discharging characteristic B) is lower than the change rate in the charging voltage indicated by the reference characteristic A, the cause of the degradation of the secondary battery 10 under diagnosis is diagnosed to be due to electrode degradation of the secondary battery 10.

On the other hand, the change rate in the charging voltage is compared between the charging characteristic specified from the measured values of the terminal voltage of the secondary battery 10 and the reference characteristic A of the secondary battery based on the initial value. Then, in relation to the voltage variation immediately after the current interruption, when it is determined that the change amount in a range of 0 to 0.1 sec (change amount in voltage corresponding to the charging/discharging characteristic C) is larger than the change amount indicated by the reference characteristic A, the cause of the degradation of the secondary battery 10 under diagnosis is diagnosed to be due to electrolyte degradation.

In the secondary battery 10, the electrode degradation and the electrolyte degradation sometimes simultaneously occur or the electrode degradation and the electrolyte degradation sometimes separately occur. Specifically, the diagnostic unit 3 performs the determination based on a flowchart described later.

FIG. 3 is a flowchart illustrating a control procedure of the diagnostic device for assessing the degradation of the secondary battery illustrated by this embodiment. ST1 to ST10 indicate each step. Each step is realized by loading a control program stored in the EEPROM into the RAM and executing the control program. Hereinafter, processing is described which includes diagnosing the cause of the degradation of the secondary battery 10 by comparing the charging characteristic B specified from the measured values of the terminal voltage of the secondary battery and the reference characteristic A of the secondary battery based on the initial value. It is assumed that data indicating voltage values of the reference characteristic A of the secondary battery based on the initial value is stored in the storage unit 3A.

Charging from the charging circuit 11 to the secondary battery 10 is started (ST1). The charging is continued until the terminal voltage of the secondary battery 10 measured by the voltage measuring unit 2 reaches a fully charged voltage (ST2). Then, when the secondary battery 10 is fully charged, the discharging circuit 12 starts discharging of the secondary battery 10 (ST3). Then, the voltage measuring unit 2 begins accumulating over time a variation state of the terminal voltage of the secondary battery 10 as measured data in a memory 2A (ST4). Next, the current interruption unit 1 controls the discharging circuit 12 to interrupt the discharging current of the secondary battery 10 (ST5).

Next, when it is confirmed by a timer (not illustrated) that the predetermined time has passed (ST6), the diagnostic unit 3 compares the reference characteristic A of a non-degraded secondary battery stored in advance in a memory 3A, the charging characteristic B specified from the measured values of the terminal voltage of the secondary battery indicating the variation state of the terminal voltage of the secondary battery 10 stored in the memory 2A, and the change rate in voltage immediately after the current interruption in relation to the reference characteristic A of the secondary battery based on the initial value; and the diagnostic unit 3 determines whether the change rate in voltage in a range of 0.1 to 600 sec (change rate in voltage corresponding to the charging/discharging characteristic B) is lower than the change rate in the reference characteristic A (ST7).

Herein, when the diagnostic unit 3 determines that the change rate in voltage over time of the charging/discharging characteristic B is lower than that of the reference characteristic A, the diagnostic unit 3 diagnoses that the cause of the degradation of the secondary battery 10 is due to electrode degradation (ST8), so that this processing is ended.

On the other hand, when the diagnostic unit 3 determines in ST7 that the change rate in voltage over time is not lower than that of the reference characteristic A, the processing proceeds to ST9. Then, the diagnostic unit 3 compares the change amount in the charging voltage between the reference characteristic A of the secondary battery based on the initial value and the charging/discharging characteristic. In this embodiment, in relation to the voltage variation immediately after the current interruption of the charging/discharging characteristic, when the diagnostic unit 3 determines that the change amount in voltage in a range of 0 to 0.1 sec (change amount in voltage corresponding to the charging characteristic C) is larger than the change amount in voltage indicated by the reference characteristic A, the processing proceeds to ST 10. Then, the diagnostic unit 3 diagnoses that the cause of the degradation of the secondary battery 10 under diagnosis is due to electrolyte degradation.

Next, in ST11, data based on the voltage variation of the charging/discharging characteristic B or the charging/discharging characteristic C is stored in a database DB (not illustrated), so that this processing is ended.

In ST9, the diagnostic unit 3 compares the change amount in voltage of the charging voltage between the reference characteristic A of the secondary battery based on the initial value and the charging/discharging characteristic. Then, in relation to the voltage variation immediately after the current interruption, when the diagnostic unit 3 determines that the change amount in voltage in a range of 0 to 0.1 sec is smaller than the change amount in voltage indicated by the reference characteristic A, the processing is ended.

When it is determined from the charging/discharging characteristics that the electrolyte has degraded, a charger can be charged in a quick charging mode on and after the determination.

Effects of First Embodiment

This embodiment can correctly diagnose whether the cause of the degradation of the secondary battery is due to the electrode degradation or the electrolyte degradation of the secondary battery by comparing the voltage variation characteristics based on the charging/discharging characteristics specified from the measured values of the terminal voltage of the secondary battery containing the all-solid-state battery and the reference characteristic of the secondary battery based on the initial value.

Second Embodiment

The embodiment described above describes the case of identifying and diagnosing whether the cause of the degradation of the secondary battery is due to the electrode degradation or the electrolyte degradation of the secondary battery. When the diagnostic unit 3 specifies that the cause of the degradation of the secondary battery 10 is due to the electrode degradation of the secondary battery 10 in ST8 above, a control to switch the charging mode of the secondary battery 10 from a quick charging mode to a normal charging mode may be added.

FIG. 4 is a flowchart illustrating a control procedure of the diagnostic device for assessing the degradation of the secondary battery illustrated by this embodiment. ST1 to ST12 indicate each step. Each step is realized by loading the control program stored in the EEPROM into the RAM and executing the control program. The same processing as that in FIG. 4 is designated by the same step number and descriptions thereof are omitted.

When the diagnostic unit 3 diagnoses that the cause of the degradation of the secondary battery 10 is due to the electrode degradation in ST8, the diagnostic unit 3 instructs the prohibition of the quick charging mode as the next charging mode to the charging control unit 13 (ST12), so that this processing is ended.

According to this processing, the charging control unit 13 can perform a control to prohibit the quick charging mode to give priority to the normal charging mode as the next charging mode.

The diagnostic unit 3 may be configured to notify an external device or an external display device of the diagnosis result of the secondary battery 10 via an interface.

Effects of Second Embodiment

According to this embodiment, the quick charging causing the progress of the degradation of the secondary battery can be avoided at an appropriate timing and charging at a normal rate can be continued while prolonging the battery life.

Third Embodiment

This embodiment assumes an environment, as an environment for charging the secondary battery, where the secondary battery itself does not move. However, the secondary battery, which is the all-solid-state battery, may be configured so that the charging can be carried out in an environment where the secondary battery is mounted in a mobile body.

Effects of Third Embodiment

According to this embodiment, the secondary battery to be mounted in a mobile body, e.g., mounted in a vehicle, may be configured by applying the present invention so that charging which leads to degradation of the secondary battery is limited, thereby enabling the period between replacing the secondary battery to be prolonged.

The disclosure of this embodiment is an example. Since the present invention is applicable to electronic devices using the secondary battery, various combinations are assumed.

Fourth Embodiment

The embodiments described above describe the case where the secondary battery 10 is connected to a charging device or the like and the secondary battery 10, which is the all-solid-state battery, is diagnosed when the discharging current is interrupted. A configuration may be acceptable in which the secondary battery 10 is connected to a charging device or the like and the secondary battery 10, which is the all-solid-state battery, may be diagnosed when a charging current is interrupted.

FIG. 5 is a figure illustrating the concept of interruption characteristics in charging of a degradation diagnostic model stored in the storage unit 3A illustrated in FIG. 1. FIG. 5 illustrates a case where the time axis in FIG. 5 is common to the reference characteristic A and the charging/discharging characteristics B and C immediately after a secondary battery to be diagnosed is charged as described later. This example illustrates the charging/discharging characteristics of the secondary battery 10 immediately after the charging current interruption. Herein, the reference characteristic A is a characteristic indicated by a solid line in FIG. 5. The charging/discharging characteristic B is a characteristic indicated by alternate long and short dashed lines in FIG. 5. The charging/discharging characteristic C is a characteristic indicated by dashed lines in FIG. 5.

In FIG. 5, the charging/discharging characteristic B corresponds to an electrode degradation characteristic and the charging/discharging characteristic C corresponds to an electrolyte degradation characteristic.

In this embodiment, reverse processing to the charging processing is performed for the diagnosis of the diagnostic unit 3 in the processing illustrated in FIGS. 3 and 4.

Effects of Fourth Embodiment

This embodiment can correctly diagnose whether the cause of the degradation of the secondary battery is due to the electrode degradation or the electrolyte degradation of the secondary battery by comparing the voltage variation characteristics based on the charging/discharging characteristics specified from the measured values of the terminal voltage of the secondary battery, which is the all-solid-state battery, and the reference characteristic of the secondary battery based on the initial value.

What is claimed is:

1. A secondary battery diagnostic device comprising:
an interruption means configured to interrupt a charging current or a discharging current of a secondary battery connected to a charging circuit or a discharging circuit;
a measuring means configured to measure over time a variation characteristic of a terminal voltage of the secondary battery after the charging current or the discharging current is interrupted by the interruption means; and
a diagnostic means configured to diagnose a cause of degradation of the secondary battery distinguishing between electrode degradation and electrolyte degradation by comparing a change rate or a change amount in voltage between a charging/discharging characteristic specified from a measured value of the terminal voltage of the secondary battery measured by the measuring means and a reference characteristic of the secondary battery based on an initial value.

2. The secondary battery diagnostic device according to claim 1, wherein the secondary battery is an all-solid-state battery containing a solid electrolyte transporting a lithium ion.

3. The secondary battery diagnostic device according to claim 1, wherein the diagnostic means is configured to compare a change rate in voltage between the charging/discharging characteristic specified from the measured value of the terminal voltage of the secondary battery and the reference characteristic of the secondary battery based on the initial value, and in a case in which the diagnostic means determines that the change rate in voltage immediately after the current interruption is lower than the change rate in voltage indicated by the reference characteristic, the diagnostic means is configured to diagnose that the cause of the degradation of the secondary battery under diagnosis is due to electrode degradation of the secondary battery.

4. A secondary battery diagnostic device comprising:
an interruption means configured to interrupt a charging current or a discharging current of a secondary battery connected to a charging circuit or a discharging circuit;
a measuring means configured to measure over time a variation characteristic of a terminal voltage of the secondary battery after the charging current or the discharging current is interrupted by the interruption means; and
a diagnostic means configured to diagnose a cause of degradation of the secondary battery by comparing a change rate or a change amount in voltage between a charging/discharging characteristic specified from a measured value of the terminal voltage of the secondary battery measured by the measuring means and a reference characteristic of the secondary battery based on an initial value,
wherein the diagnostic means is configured to compare the charging/discharging characteristic specified from the measured value of the terminal voltage of the secondary battery, the reference characteristic of the secondary battery, and a change rate in voltage variation in a range of 0.1 to 600 sec immediately after the current interruption, and in a case in which the diagnostic means determines that a change rate in voltage immediately after the current interruption is lower than a change rate in voltage indicated by the reference characteristic, the diagnostic means is configured to diagnose that the cause of the degradation of the secondary battery under diagnosis is due to electrode degradation of the secondary battery.

5. A secondary battery diagnostic device comprising:
an interruption means configured to interrupt a charging current or a discharging current of a secondary battery connected to a charging circuit or a discharging circuit;
a measuring means configured to measure over time a variation characteristic of a terminal voltage of the secondary battery after the charging current or the discharging current is interrupted by the interruption means; and
a diagnostic means configured to diagnose a cause of degradation of the secondary battery by comparing a change rate or a change amount in voltage between a charging/discharging characteristic specified from a measured value of the terminal voltage of the secondary battery measured by the measuring means and a reference characteristic of the secondary battery based on an initial value,
wherein the diagnostic means is configured to diagnose that the cause of the degradation of the secondary battery under diagnosis is due to electrolyte degradation in a case in which the diagnostic means determines that a change amount in a range of 0 to 0.1 sec is larger than a change amount indicated by the reference characteristic, in relation to voltage variation immediately after the current interruption of voltage, between the charging/discharging characteristic specified from the measured value of the terminal voltage of the secondary battery, and the reference characteristic of the secondary battery based on an initial value.

6. The secondary battery diagnostic device according to claim 1, wherein in a case in which the diagnostic means diagnoses that the cause of the degradation of the secondary battery under diagnosis is due to electrode degradation of the secondary battery, the charging circuit does not execute quick charging to the secondary battery.

7. The secondary battery diagnostic device according to claim 2, wherein in a case in which the diagnostic means diagnoses that the cause of the degradation of the secondary battery under diagnosis is due to electrode degradation of the secondary battery, the charging circuit does not execute quick charging to the secondary battery.

8. The secondary battery diagnostic device according to claim 3, wherein in a case in which the diagnostic means diagnoses that the cause of the degradation of the secondary battery under diagnosis is due to the electrode degradation of the secondary battery, the charging circuit does not execute quick charging to the secondary battery.

9. The secondary battery diagnostic device according to claim 4, wherein in a case in which the diagnostic means diagnoses that the cause of the degradation of the secondary battery under diagnosis is due to the electrode degradation of the secondary battery, the charging circuit does not execute quick charging to the secondary battery.

10. The secondary battery diagnostic device according to claim 1, wherein the secondary battery is a lithium-ion battery.

11. The secondary battery diagnostic device according to claim 2, wherein the secondary battery is a lithium-ion battery.

12. The secondary battery diagnostic device according to claim 3, wherein the secondary battery is a lithium-ion battery.

13. The secondary battery diagnostic device according to claim 4, wherein the secondary battery is a lithium-ion battery.

14. The secondary battery diagnostic device according to claim 5, wherein the secondary battery is a lithium-ion battery.

15. The secondary battery diagnostic device according to claim 6, wherein the secondary battery is a lithium-ion battery.

16. The secondary battery diagnostic device according to claim 7, wherein the secondary battery is a lithium-ion battery.

17. The secondary battery diagnostic device according to claim 8, wherein the secondary battery is a lithium-ion battery.

18. The secondary battery diagnostic device according to claim 9, wherein the secondary battery is a lithium-ion battery.

\* \* \* \* \*